United States Patent
Webb et al.

(10) Patent No.: US 9,333,733 B2
(45) Date of Patent: May 10, 2016

(54) MULTI-PART MASK FOR IMPLANTING WORKPIECES

(71) Applicant: Varian Semiconductor Equipment Associates, Inc., Gloucester, MA (US)

(72) Inventors: Aaron P. Webb, Austin, TX (US); Charles T. Carlson, Cedar Park, TX (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 110 days.

(21) Appl. No.: 14/322,389

(22) Filed: Jul. 2, 2014

(65) Prior Publication Data

US 2015/0028232 A1  Jan. 29, 2015

Related U.S. Application Data

(60) Provisional application No. 61/858,719, filed on Jul. 26, 2013.

(51) Int. Cl.
*B32B 37/18* (2006.01)
*H01L 21/266* (2006.01)

(52) U.S. Cl.
CPC .............. *B32B 37/18* (2013.01); *H01L 21/266* (2013.01); *H01J 2237/31711* (2013.01); *Y10T 29/49895* (2015.01)

(58) Field of Classification Search
CPC .................. B32B 37/18; H01L 21/266; H01J 2237/31711; Y10T 29/49895
See application file for complete search history.

(56) References Cited

U.S. PATENT DOCUMENTS

| 4,967,088 | A | * | 10/1990 | Stengl | B82Y 10/00 250/397 |
|---|---|---|---|---|---|
| 6,749,690 | B2 | | 6/2004 | Clark | |
| 6,862,817 | B1 | * | 3/2005 | Lenox | G03F 7/707 33/613 |
| 2004/0238759 | A1 | | 12/2004 | Noguchi | |
| 2006/0051936 | A1 | | 3/2006 | Koike | |
| 2014/0170783 | A1 | * | 6/2014 | Webb | H01L 21/266 438/14 |
| 2015/0026953 | A1 | * | 1/2015 | Webb | H01L 21/682 29/464 |

FOREIGN PATENT DOCUMENTS

CN  101582387 B  11/2010
kR  10-2009-0061309 A  6/2009

OTHER PUBLICATIONS

International Search Report and Written Opinion Mailed Nov. 19, 2014 for PCT/US2014/048181 Filed Jul. 25, 2014.

* cited by examiner

*Primary Examiner* — Jack Berman

(57) ABSTRACT

A multi-part mask has a pattern plate, which includes a planar portion that has the desired aperture pattern to be used during workpiece processing. The multi-part mask also has a mounting frame, which is used to hold the pattern plate. Prior to assembly, the pattern plate has an aligning portion, which has one or more holes through which reusable alignment pins are inserted. These alignment pins enter kinematic joints disposed on the mounting frame, which serve to precisely align the pattern plate to the mounting frame. After the pattern plate has been secured to the mounting frame, the aligning portion can be detached from the pattern plate. The alignment pins can be reused at a later time. In some embodiments, the pattern plate can later be removed from the mounting frame, so that the mounting frame may be reused.

20 Claims, 5 Drawing Sheets

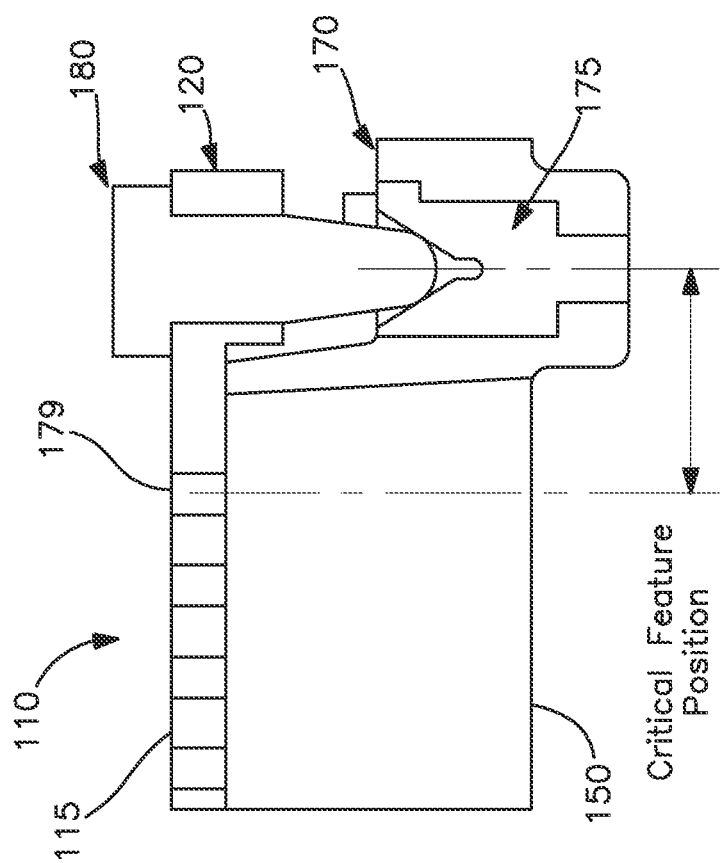

MULTI-PART MASK FOR IMPLANTING WORKPIECES

This application claims priority to U.S. Provisional Patent Application Ser. No. 61/858,719, filed Jul. 26, 2013, the disclosure of which is incorporated herein by reference in its entirety.

STATEMENT REGARDING FEDERALLY SPONSORED RESEARCH OR DEVELOPMENT

This invention was made with Government support under Contract No. DE-EE0004737 awarded by the Department of Energy. The Government has certain rights in this invention.

FIELD

Embodiments of the present disclosure relate to methods and an apparatus for creating a mask to be used during workpiece processing, and more particularly, during ion implanting.

BACKGROUND

Semiconductor workpieces are often implanted with dopant species to create a desired conductivity. For example, solar cells may be implanted with a dopant species to create an emitter region. Typically, ions are created by an ion source. The ion source may be a plasma chamber that utilizes RF energy to create ions, or may be an indirectly heated cathode (IHC), or another type of ion source. The ions are extracted from the ion source, and may pass through mass analyzing and focusing components before reaching the workpiece. In some embodiments, the extracted ions are implanted directly in the workpiece and there are no components between the ion source and the workpiece. The workpiece is also disposed on a platen, which holds the workpiece in place.

Often, only portions of a workpiece are implanted. Therefore, a mechanism, such as a mask is inserted between the ion source and the workpiece to block ions from reaching certain portions of the workpiece. This mask may be aligned to the workpiece such that the regions covered by the mask are tightly controlled.

Precise alignment of the mask to the workpiece, and precise machining of the pattern for the mask may increase the cost of the mask.

Thus, it would be beneficial if there were a mask that was less expensive to manufacture. Further, it would be beneficial if portions of the mask, such as expensive or scarce parts, were reusable.

SUMMARY

A multi-part mask has a pattern plate, which includes a planar portion that has the desired aperture pattern to be used during workpiece processing. The multi-part mask also has a mounting frame, which is used to hold the pattern plate. Prior to assembly, the pattern plate has an aligning portion, which has one or more holes through which reusable alignment pins are inserted. These alignment pins enter kinematic joints disposed on the mounting frame, which serve to precisely align the pattern plate to the mounting frame. After the pattern plate has been secured to the mounting frame, the aligning portion can be detached from the pattern plate. The alignment pins can be reused at a later time. In some embodiments, the pattern plate can later be removed from the mounting frame, so that the mounting frame may be reused.

In one embodiment, a mask for use during processing of a workpiece is disclosed. The mask comprises a pattern plate comprising a planar portion comprising a series of apertures forming a pattern to be used during processing of the workpiece; a mounting frame comprising an outer perimeter onto which the planar portion is affixed and an alignment protrusion comprising one or more kinematic joints to facilitate alignment between the mounting frame and the pattern plate; and a structural bonding agent to secure the pattern plate and the mounting frame.

In a second embodiment, a method of forming a mask for use during workpiece processing is disclosed. The method comprises passing an alignment pin through a hole in an aligning portion of a pattern plate, the pattern plate further comprising a planar portion comprising a series of apertures forming a pattern to be used during the workpiece processing, the aligning portion disposed adjacent the planar portion; entering the alignment pin into a kinematic joint in an alignment protrusion in a mounting frame; using one or more bonding agents to secure the planar portion to the mounting frame while the alignment pin is engaged in the kinematic joint; and removing the alignment pin from the kinematic joint.

In a third embodiment, a method of forming a mask for use during workpiece processing is disclosed. The method comprises aligning a pattern plate to a mounting frame adapted to hold the pattern plate, wherein the pattern plate comprises a planar portion comprising a series of apertures forming a pattern to be used during the workpiece processing; and securing the pattern plate to the mounting frame.

BRIEF DESCRIPTION OF THE FIGURES

For a better understanding of the present disclosure, reference is made to the accompanying drawings, which are incorporated herein by reference and in which:

FIG. 6 is a side view of the alignment between the pattern plate and the mounting frame.

DETAILED DESCRIPTION

Figure 1:
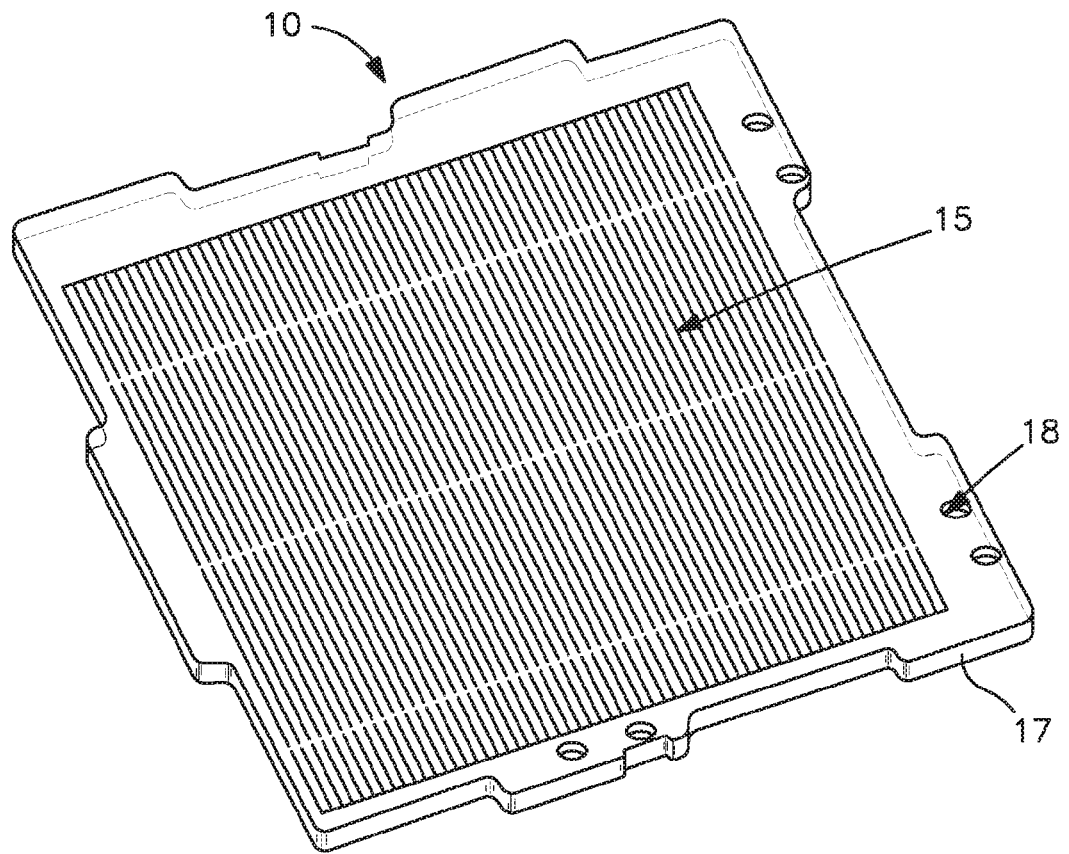
FIG. 1 shows an embodiment of a one-piece implant.

FIG. 1 shows a one-piece mask. This mask 10 includes a deep recessed center portion 15, which is machined to include the desired pattern. Along the edges of the mask 10, protrusions 17 may be disposed. In at least one of these protrusions 17, one or more alignment holes 18 may be disposed. In some embodiments, kinematic joints (not shown) are integrated into the alignment holes 18, such that these joints rest on and align with pins located on the underlying platen. These kinematic joints may be silicon carbide. The kinematic joints may be designed to have a v-type groove, which allows precise alignment to a respective alignment pin disposed on the platen or electrostatic chuck. These kinematic joints may be effective in creating precise alignment between the mask 10 and the workpiece.

However, there may be drawbacks to these masks 10. First, the deep recessed center portion 15 may be difficult to machine, increasing the time needed to create a mask, as well as the cost associated with each mask. In addition, manufacturing yield of these masks may be impacted due to this feature. In addition, the kinematic joints may be very expensive and have long procurement times. Since these kinematic joints are integral to the mask 10, the inability to acquire these kinematic joints may affect the overall availability of these masks 10. In addition, the machined pattern in the deep recessed center portion 15 may erode over time due to the effects of the bombardment of ions. This renders the mask 10 inoperable, and the entire device, including the scarce kinematic joints, is then discarded.

As described above, although fully capable of creating a precision alignment, a one-piece integral mask 10 for use with ion implantation may have various deficiencies, including difficulty in manufacturing, yield, useful life and availability of scarce components. The present disclosure also describes a multi-part mask which overcomes many of these disadvantages. While the multi-part mask is described with respect to ion implantation, it is understood that the multi-part mask may be used for other workpiece processes, such as deposition or etching.

Figure 2:
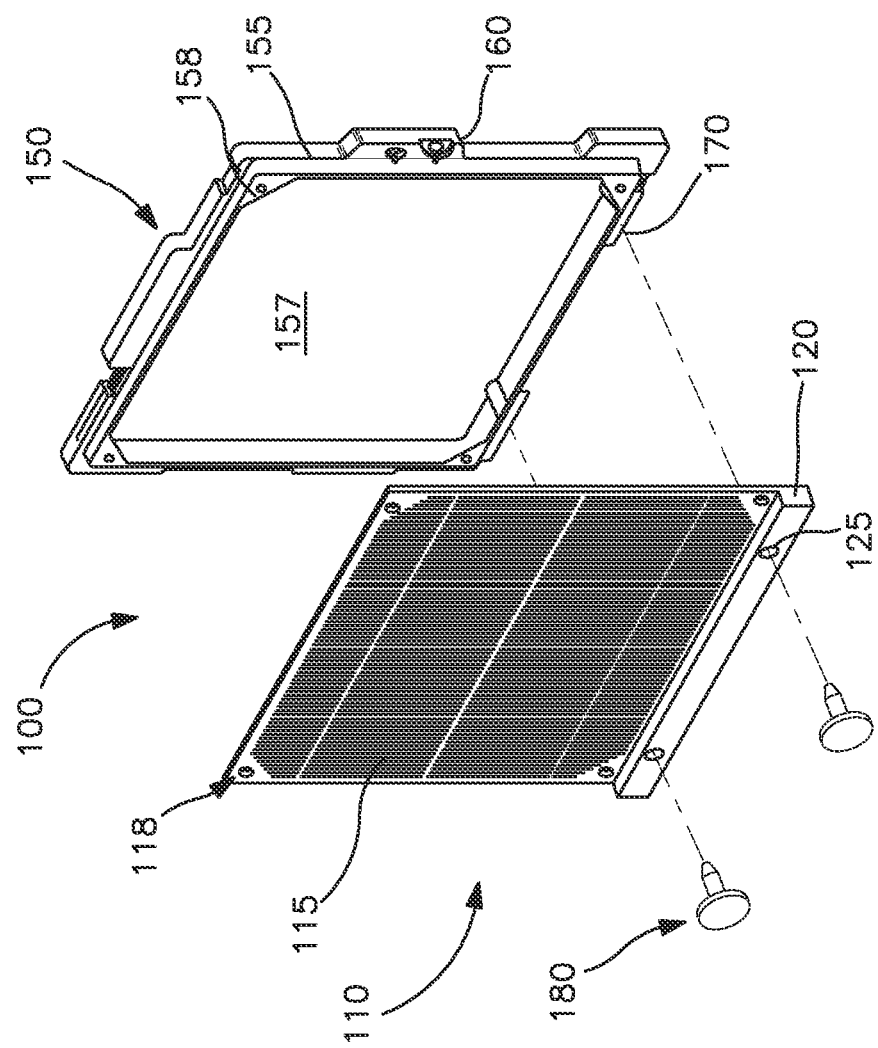
FIG. 2 shows an expanded view of the components used in one embodiment of the multi-part mask prior to assembly.

FIG. 2 shows an expanded view of one embodiment of the multi-part mask 100 prior to assembly. The multi-part mask 100 includes a pattern plate 110 and a mounting frame 150. The pattern plate 110 may be constructed of graphite, although other materials may also be used. The pattern plate 110 includes a substantially planar portion 115, includes the apertures that form the pattern that is to be used during the ion implantation process. This pattern may be a series of narrow slots, or any other desired pattern. This pattern may be created by machining the planar portion 115 of the pattern plate 110 using known machining techniques, such as milling, drilling, EDM wire cutting, grinding or saw cutting. The planar portion 115 may also include a plurality of boss joints 118. These boss joints 118 are used to bond the pattern plate 110 to the mounting frame 150, as will be described in more detail below. The edges of the planar portion 115 may be in the shape of a square, although other shapes, such as, but not limited to, rectangular or circular are also possible.

The pattern plate 110 may also include an aligning portion 120. This aligning portion 120 may be disposed along one or more edges of the planar portion 115. This aligning portion 120 may be thicker than the planar portion 115, although other embodiments are possible. The aligning portion 120 includes one or more holes 125 through which reusable alignment pins 180 may be inserted, as is described in more detail below.

The mounting frame 150 comprises an outer perimeter 155 having an open center area 157. The mounting frame 150 may be constructed of graphite. In some embodiments, the mounting frame 150 and the pattern plate 110 are constructed of the same material such that their coefficients of thermal expansion are similar or identical. The mounting frame 150 has an upper surface, which faces the pattern plate 110, and a lower surface, which faces the platen or electrostatic chuck when in use. The pattern plate 110 is affixed to the upper surface of the mounting frame 150 such that the pattern that is machined in the planar portion 115 is within this open center area 157. The outer perimeter 155 may also include a plurality of bosses 158 (best seen in FIG. 5), which can mate with the boss joints 118 located on the planar portion 115. Along the outer edge of the outer perimeter 155 may be one or more protrusions or ears 160. The protrusions or ears 160 may include kinematic joints (not shown) that may be used to attach and precisely align the multi-part mask 100 to the platen. These kinematic joints in the protrusions or ears 160 are oriented downward (i.e. toward the lower surface) to communicate with alignment pins on the platen. An alignment protrusion 170 may also be disposed along one edge of the outer perimeter 155. The alignment protrusion 170 is disposed along the same edge as the aligning portion 120 of the pattern plate 110 and is used to align the pattern plate 110 to the mounting frame 150. The alignment protrusion 170 may include kinematic joints (not shown). Unlike the kinematic joints in the ears 160, the kinematic joints in the alignment protrusion 170 are oriented upward (i.e. toward the upper surface) so as to accept reusable alignment pins 180.

To assemble the multi-part mask 100, the pattern plate 110 is aligned with the mounting frame 150 using reusable alignment pins 180. These alignment pins 180 pass through the holes 125 in the aligning portion 120 of the pattern plate 110, and enter the kinematic joints disposed on the alignment protrusion 170. These holes 125 are dimensioned such that the alignment pins 180 fit within the holes 125 with little tolerance, assuring a repeatable precise alignment of the pattern plate 110 and the mounting frame 150. The diameter of these holes 125 is held to a tight tolerance to ensure a light interference fit with the alignment pins 180. In this way, the alignment pin 180 is perfectly located relative to the critical mask pattern features without any tolerance margin. With the alignment pins 180 now pressed into the hole 125, an inseparable assembly is created. This joint pattern plate/alignment pin assembly may be kinematically coupled to the mounting frame 150 with the tips of the alignment pins 180 engaging with the cones and v grooves of the mounting frame 150 so that the pattern plate 110 is perfectly positioned. Later, the aligning portion 120 of the pattern plate 110 which contain the holes 125 where the alignment pins 180 are press-fit may be machined away. The alignment pins 180 may be reused by breaking away the spare graphite around them.

This alignment process also causes the bosses 158 on the outer perimeter 155 of the mounting frame 150 to extend through the boss joints 118 on the planar portion 115.

Figure 3:
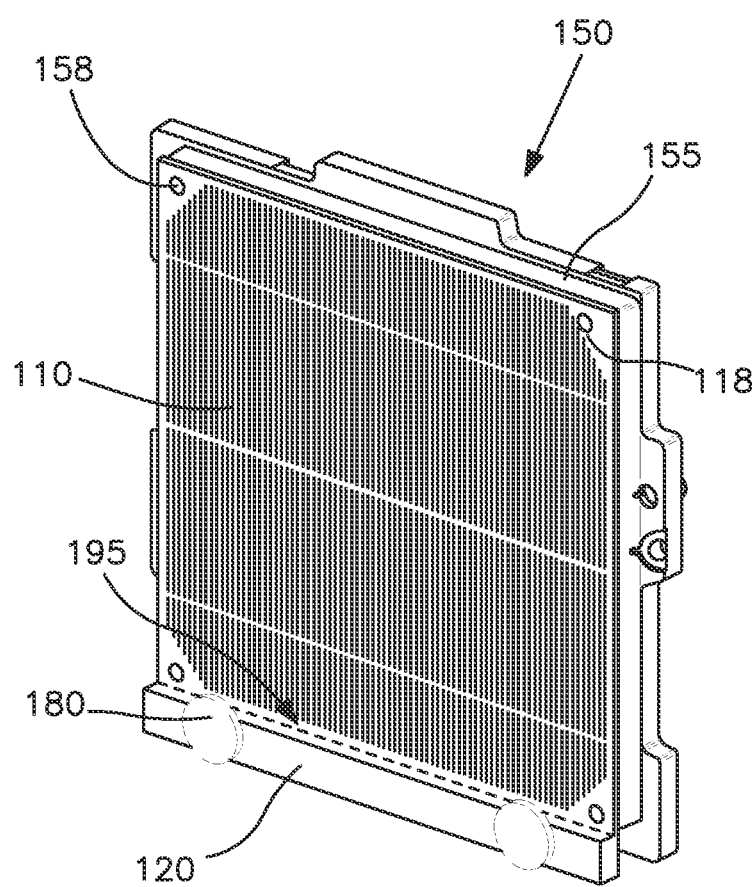
FIG. 3 shows a view of the components used in the multi-part mask in a stage of assembly.

FIG. 3 shows the pattern plate 110 during this alignment process. As described above, the reusable alignment pins 180 pass through the holes 125 in the aligning portion 120. Bosses 158 extend through the boss joints 118 in the planar portion 115. These bosses 158 may serve as a structural bonding agent, helping to secure the pattern plate 110 to the mounting frame 150. For example, after the pattern plate 110 has been aligned to the mounting frame 150 using the reusable alignment pins 180, epoxy may be added to the boss joints 118, holding the bosses 158 in precise alignment. The epoxy serves to hold the bosses 158 in a precise position relative to the boss joints 118.

In addition to the structural bonding agent, a second bonding agent, such as an adhesive, may be used. In this embodiment, the adhesive is disposed along the edge of the planar portion 115, or along the corresponding portion of the mounting frame 150. As the pattern plate 110 and the mounting frame 150 are brought together, the reusable alignment pins 180 insure proper alignment. As the pattern plate 110 contacts the mounting frame 150, the adhesive helps bond the two pieces together. In addition, the adhesive may be thermally conductive so as to transfer heat from the pattern plate 110 to the mounting frame 150.

Figure 4:
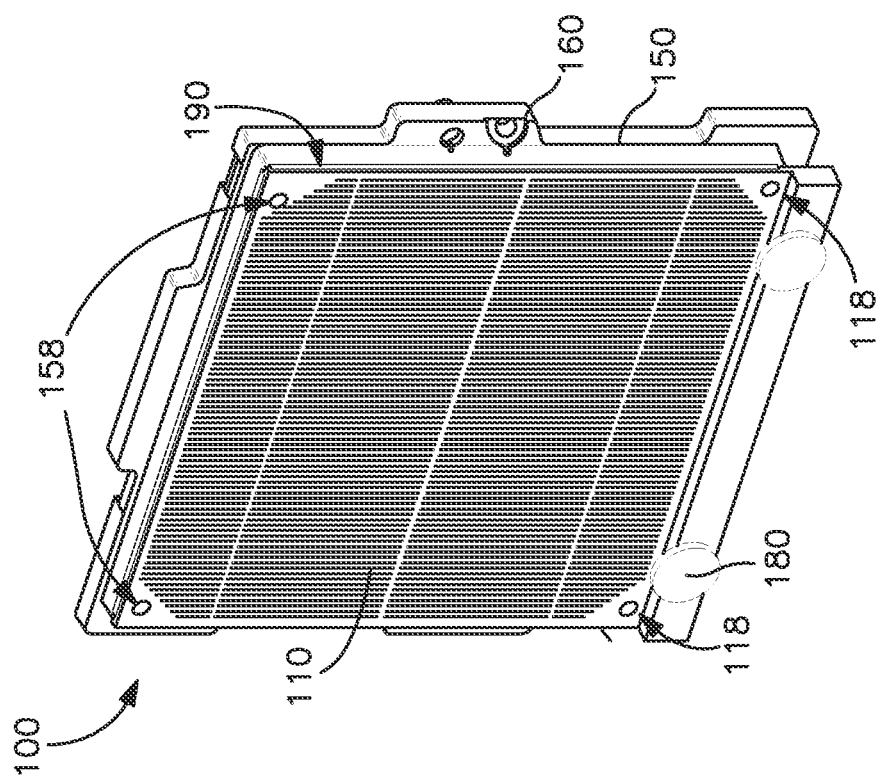
FIG. 4 shows a view of the components used in the multi-part mask in a stage of assembly according to a second embodiment.

FIG. 4 shows a view of the multi-part mask 100 during this embodiment. The reusable alignment pins 180 are shown aligning the pattern plate 110 and the mounting frame 150. The bosses 158 extend through the boss joints 118 and an adhesive 190 is shown around the perimeter of the planar portion 115. The adhesive 190 may be thermally conductive, such that heat generated in the planar portion 115 due to the bombardment of ions can be passed to and dissipated by the mounting frame 150.

Figure 5:
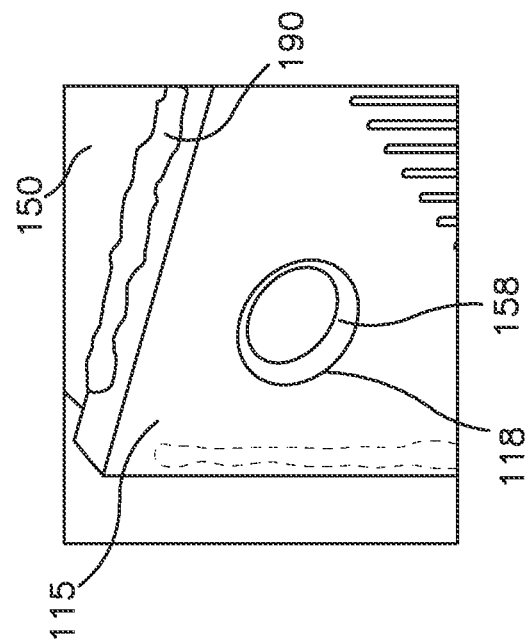
FIG. 5 is an expanded view of one portion of the multi-part mask of FIG. 4.

FIG. 5 shows an enlarged view of one corner of the planar portion 115. This view shows the boss 158 extending through the boss joint 118. Also shown is the adhesive 190 that is used as a second bonding agent, affixing the planar portion 115 to the mounting frame 150.

As mentioned above, proper alignment of the pattern plate 110 and the mounting frame 150 may be critical. FIG. 6 shows a side cutaway view of this alignment process. As described earlier, the reusable alignment pin 180 passes through the aligning portion 120 of the pattern plate 110. The alignment pin 180 then enters the kinematic joint 175 disposed in the alignment protrusion 170 of the mounting frame 150. The alignment pin 180 and the kinematic joint 175 are aligned very precisely. This allows the relationship between the pattern 179 in the planar portion 115 and the edge of the mounting frame 150 to also be tightly controlled.

After the pattern plate 110 and the mounting frame 150 have been secured to one another using one or more bonding agents, the reusable alignment pins 180 may be removed from the aligning portion 120. Additionally, if desired, the aligning portion 120 of the pattern plate 110 may be removed, such as by breaking it away from the planar portion 115, or by machining it off. For example, the aligning portion 120 may be removed at line 195, as seen in FIG. 3. This leaves only the planar portion 115 of the pattern plate 110 attached to the mounting frame 150. Thus, the completed assembled multi-part mask 100 resembles the one piece mask (see FIG. 1), and can used as that mask is used.

The above description discloses the use of two bonding agents; a structural bonding agent in the form of an epoxy joining a boss 158 and boss joint 118, and a second bonding agent in the form of an adhesive 190, such as a thermally conductive adhesive. It should be noted that both bonding agents may be used, or only one of these two agents may be employed. In addition, other bonding agents may be used in place of, or in addition to, one or both of these recited bonding agents. For example, in one embodiment, pins may be used as the structural bonding agent. In another embodiment, screws may be used as the structural bonding agent.

For example, the pattern plate 110 and the mounting frame 150 may be aligned as described above. A match drilled set of holes may be made through the pattern plate 110 and the mounting frame 150. A pin or screw can then be inserted into the hole, attaching the mounting frame 150 and the pattern plate 110. In other words, after alignment, a hole is drilled through both the pattern plate 110 and the mounting frame 150, which is used to hold a pin or screw.

The use of pins or screws as bonding agents may allow the non-destructive separation of the mounting frame 150 from the planar portion 115. For example, the pattern in the planar portion 115 may erode or deteriorate due to the bombardment of ions. By using a removable structural bonding agent, it may be possible to separate these components, discard the planar portion 115 and reuse the mounting frame 150. This has the advantage that many of the scarce or expensive components, such as the kinematic joints, are disposed in the mounting frame 150 and are therefore available for reuse.

In this case, the planar portion 115 would be removed from the mounting frame 150, such as by removing the pins or screws. The adhesive may be weak enough, such that the planar portion 115 and the mounting frame 150 can be separated without any damage to the mounting frame 150. A new pattern plate 110 would then be aligned to the mounting frame 150, using the technique described above. After the new pattern plate 110 is aligned with the mounting frame 150, new holes are made for the pins or screws. In one embodiment, a new set of holes, separate from the hole previous made in the mounting frame 150, is drilled through the pattern plate 110 and mounting frame 150. A pin or screw is then inserted into this newly drilled hole. Note that this process may limit the number of times that a mounting frame 150 may be used, as there is limited space to drill these holes. In another embodiment, the new hole is made in the pattern plate 110 by drilling through the hole previously drilled in the mounting frame 150 through the pattern plate 110. In this way, it may be possible to utilize the previously drilled holes in the mounting frame 150, and simply add holes to the pattern plate 110 that are aligned to these pre-existing holes. In other words, the previously existing hole in the mounting frame 150 is used as the guide to drill a hole through the new pattern plate 110.

In either embodiment, after the pins or screws are inserted into the drilled holes, the aligning portion 120 of this new pattern plate 110 would be removed and the new multi-part mask 100, which comprised a new pattern plate 110 and the original mounting frame 150, would be available for use.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A mask for use during processing of a workpiece, comprising:
    a pattern plate comprising a planar portion comprising a series of apertures forming a pattern to be used during processing of said workpiece;
    a mounting frame comprising:
        an outer perimeter onto which said planar portion is affixed; and
        an alignment protrusion comprising one or more kinematic joints to facilitate alignment between said mounting frame and said pattern plate; and
    a structural bonding agent to secure said pattern plate and said mounting frame.

2. The mask of claim 1, wherein said structural bonding agent comprises:
    a plurality of bosses disposed on said mounting frame; and
    a plurality of corresponding boss joints disposed on said pattern plate, wherein said bosses extend through said boss joints.

3. The mask of claim 2, wherein an epoxy is disposed in said boss joints.

4. The mask of claim 1, wherein said structural bonding agent comprises a plurality of pins or screws inserted in holes disposed in said pattern plate and said mounting frame.

5. The mask of claim 1, further comprising a thermally conductive adhesive disposed between said mounting frame and said pattern plate.

6. A method of creating a mask for use during workpiece processing, comprising:
- passing an alignment pin through a hole in an aligning portion of a pattern plate, said pattern plate further comprising a planar portion comprising a series of apertures forming a pattern to be used during said workpiece processing, said aligning portion disposed adjacent said planar portion;
- entering said alignment pin into a kinematic joint in an alignment protrusion in a mounting frame;
- using one or more bonding agents to secure said planar portion to said mounting frame while said alignment pin is engaged in said kinematic joint; and
- removing said alignment pin from said kinematic joint.

7. The method of claim 6, further comprising:
- detaching said aligning portion of said pattern plate from said planar portion after removing said alignment pin.

8. The method of claim 7, wherein said aligning portion is machined off said pattern plate.

9. The method of claim 6, wherein said one or more bonding agents comprises:
- a plurality of bosses disposed on said mounting frame; and
- a plurality of corresponding boss joints disposed on said pattern plate, wherein said bosses extend through said boss joints.

10. The method of claim 9, further comprising applying an epoxy to said boss joints to secure said planar portion to said mounting frame.

11. The method of claim 6, further comprising:
- drilling a plurality of holes through said mounting frame and said planar portion after entering said alignment pin into said kinematic joint; and
- inserting a plurality of pins or screws into said holes, where said plurality of pins or screws serve as said bonding agent.

12. The method of claim 6, further comprising:
- drilling a plurality of holes through said planar portion using holed previously drilled in said mounting frame as guide, said drilling performed after entering said alignment pin into said kinematic joint; and
- inserting a plurality of pins or screws into said holes, where said plurality of pins or screws serve as said bonding agent.

13. The method of claim 6, further comprising applying a thermally conductive adhesive to said mounting frame.

14. A method of forming a mask for use during workpiece processing, comprising:
- aligning a pattern plate to a mounting frame adapted to hold said pattern plate, wherein said pattern plate comprises a planar portion comprising a series of apertures forming a pattern to be used during said workpiece processing; and
- securing said pattern plate to said mounting frame;
- wherein said pattern plate comprises an aligning portion, disposed adjacent to said planar portion, having a hole therethrough, and said mounting frame comprises a kinematic joint, wherein said aligning comprises:
- passing an alignment pin through said hole in said aligning portion so that said alignment pin enters said kinematic joint.

15. The method of claim 14, further comprising detaching said aligning portion from said pattern plate after said securing.

16. The method of claim 14, wherein said pattern plate is secured to said mounting frame using epoxy.

17. The method of claim 14, wherein said pattern plate is secured to said mounting frame using screws or pins.

18. The method of claim 14, further comprising:
- processing workpieces using said mask after said securing; and
- removing said pattern plate from said mounting frame after said workpiece processing.

19. The method of claim 18, further comprising aligning and securing a second pattern plate to said mounting frame after said pattern plate has been removed.

20. A method of forming a mask for use during workpiece processing, comprising:
- aligning a pattern plate to a mounting frame adapted to hold said pattern plate, wherein said pattern plate comprises an aligning portion and a planar portion comprising a series of apertures forming a pattern to be used during said workpiece processing;
- securing said pattern plate to said mounting frame; and
- detaching said aligning portion from said pattern plate after said securing.

* * * * *